United States Patent [19]
Givens

[11] Patent Number: 6,114,232
[45] Date of Patent: *Sep. 5, 2000

[54] METHOD FOR MAKING AN ELECTRICAL CONTACT TO A NODE LOCATION AND PROCESS FOR FORMING A CONDUCTIVE LINE OR OTHER CIRCUIT COMPONENT

[75] Inventor: John H. Givens, Meridian, Id.

[73] Assignee: Micron Technology, Inc., Boise, Id.

[*] Notice: This patent issued on a continued prosecution application filed under 37 CFR 1.53(d), and is subject to the twenty year patent term provisions of 35 U.S.C. 154(a)(2).

[21] Appl. No.: 09/187,294

[22] Filed: Nov. 5, 1998

Related U.S. Application Data

[62] Division of application No. 08/670,490, Jun. 27, 1996, Pat. No. 5,888,896.

[51] Int. Cl.[7] .................................. H01L 21/4763
[52] U.S. Cl. ..................... 438/622; 438/624; 438/637; 438/638; 438/666; 438/670; 438/672
[58] Field of Search ................................ 438/622, 624, 438/626, 633, 637, 638, 666, 668, 675, 672, 670, 671, 584

[56] References Cited

U.S. PATENT DOCUMENTS

| | | |
|---|---|---|
| 4,572,764 | 2/1986 | Fan . |
| 5,091,289 | 2/1992 | Cronin et al. . |
| 5,219,787 | 6/1993 | Carey et al. . |
| 5,266,446 | 11/1993 | Chang et al. . |
| 5,283,208 | 2/1994 | Lorsung et al. . |
| 5,461,004 | 10/1995 | Kim . |
| 5,518,963 | 5/1996 | Park . |
| 5,580,825 | 12/1996 | Labunov et al. . |
| 5,677,243 | 10/1997 | Ohsaki . |
| 5,801,099 | 9/1998 | Kim et al. . |
| 5,821,164 | 10/1998 | Kim et al. . |
| 5,888,896 | 3/1999 | Givens . |

*Primary Examiner*—John F. Niebling
*Assistant Examiner*—Lynne A. Gurley
*Attorney, Agent, or Firm*—Wells, St. John, Roberts, Gregory & Matkin P.S.

[57] ABSTRACT

An electrical contact and method for making an electrical contact to a node location is disclosed and which includes forming a substrate having a node location to which electrical connection is to be made; forming a first patterned layer of a photosensitive material over the node location; forming a first dielectric layer over the first patterned layer of photosensitive material; planarizing the first dielectric layer to expose at least a portion of the first patterned layer of photosensitive material; forming a second patterned layer of a photosensitive material over the exposed first patterned layer of photosensitive material and the first dielectric layer; forming a second dielectric layer over the second patterned layer of photosensitive material; planarizing the second dielectric layer to expose at least a portion of the second patterned layer of photosensitive material; after planarizing the second dielectric layer, removing the first and second patterned layers of photosensitive material, the removal of the first and second layers of photosensitive material forming a void to the underlying node locations; and filling the void with electrically conductive material to make electrical contact to the node location.

6 Claims, 5 Drawing Sheets

METHOD FOR MAKING AN ELECTRICAL CONTACT TO A NODE LOCATION AND PROCESS FOR FORMING A CONDUCTIVE LINE OR OTHER CIRCUIT COMPONENT

RELATED PATENT DATA

This application is a divisional application of Ser. No. 08/670,490, which was filed on Jun. 27, 1996, now U.S. Pat. No. 5,888,896.

TECHNICAL FIELD

This invention relates generally to electrical contacts and methods for making electrical contacts. In particular, the invention is directed to a method for making a conductive line which electrically connects with a node location on a substrate, and a method for forming a circuit component in electrical connection with a lower node location.

BACKGROUND OF THE INVENTION

Multi-level metallization is a critical area of concern in advanced semiconductor fabrication where designers continue to strive for circuit density maximization. Metallization interconnect techniques typically require electrical connection between metal layers or runners occurring at different elevations within a semiconductor substrate. Such is typically conducted, in part, by etching a lower contact opening through insulating materials to a lower elevation metal layer. Increased circuit density has resulted in narrower and deeper electrical contact openings between the layers within the substrate, and thus have provided increased challenges to the circuit designer.

In making electrical contact, for example, to an active silicon substrate area, prior art practice typically has included forming an insulating layer over the active area. Following the deposit of the insulating layer, photoresist is deposited and patterned. The photoresist is subsequently exposed and stripped to define an aperture in the photoresist where a contact opening to the active area is desired. The insulating layer is then anisotropically etched relative to the photoresist to define a contact opening through the insulating layer.

While the prior art processes work with various degrees of success, they have shortcomings which have detracted from their usefulness. For example, the prior art technique has resulted in a tendency to damage the silicon substrate. Still further, deep and narrow contact openings are often very difficult to fill by conventional deposition techniques such as sputtering.

An electrical contact, and method for forming an electrical contact which addresses these and other problems is the subject matter of the present invention.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

Figure 1:
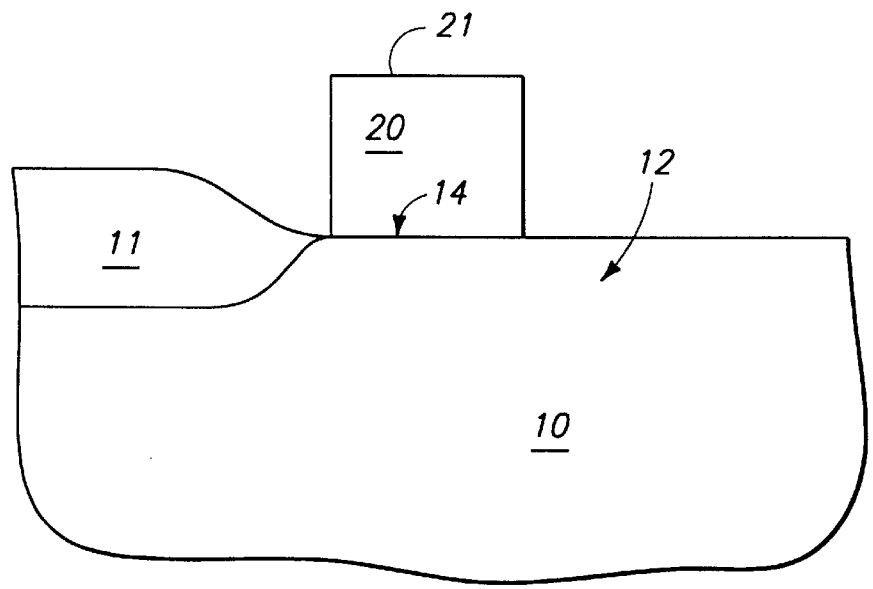
FIG. 1 is a diagrammatic sectional view of a semiconductor wafer fragment shown at a first processing step in accordance with the present invention.

This disclosure of the invention is submitted in furtherance of the constitutional purposes of the U.S. Patent Laws "to promote the progress of science and useful arts" (Article 1, Section 8).

In accordance with one aspect of the invention, a method for making electrical contact to a node location comprises:

forming a substrate having a node location to which electrical connection is to be made;

forming a first patterned layer of a photosensitive material over the node location;

forming a first dielectric layer over the first patterned layer of photosensitive material;

planarizing the first dielectric layer to expose at least a portion of the first patterned layer of photosensitive material;

forming a second patterned layer of a photosensitive material over the exposed first patterned layer of photosensitive material and the first dielectric layer;

forming a second dielectric layer over the second patterned layer of photosensitive material;

planarizing the second dielectric layer to expose at least a portion of the second patterned layer of photosensitive material;

after planarizing the second dielectric layer, removing the first and second patterned layers of photosensitive material, the removal of the first and second patterned layers of photosensitive material forming a void to the underlying node location; and filling the void with electrically conductive material to make electrical contact to the node location.

Another aspect of the present invention relates to a method for making a conductive line which electrically connects with a node location on a substrate, comprising:

forming upper and lower photosensitive material masking blocks over the node location, the lower photosensitive masking block comprising a positive image of a contact opening to the node location, and the upper photosensitive masking block comprising a positive image of a conductive line;

forming dielectric material around the upper and lower photosensitive masking blocks;

removing the upper and lower photosensitive masking blocks from the dielectric material to leave a contact opening void and an overlying line void; and filling the contact opening void and overlying line void with electrically conductive material to form a conductive line in electrical connection with the node location.

Still a further aspect of the present invention relates to a method for forming a circuit component in electrical connection with a lower node location, comprising:

forming upper and lower photosensitive material masking blocks over the node location, the lower photosensitive masking block comprising a positive image of a contact opening to the node location, and the upper photosensitive masking block comprising a positive image of a circuit component;

forming dielectric material around the upper and lower photosensitive masking blocks;

removing the upper and lower photosensitive masking blocks from the dielectric material to leave a contact opening void and an overlying circuit component void; and filling the contact opening void and overlying circuit component void with electrically conductive material to form a circuit component in electrical connection with the node location.

Referring now to FIG. 1, a semiconductor wafer is indicated generally by reference to numeral 10. A field oxide region 11 is formed on the wafer 10. An active area 12 is located adjacent the field oxide region 11. The active area region 12 defines a node location 14 to which an electrical connection is to be made.

As seen in FIG. 1, a first layer of patterned photosensitive material or lower photosensitive material masking block 20 is formed over the node location 14. The first layer of patterned photosensitive material 20 has a top surface 21. Preferably, the first layer of photosensitive material 20 comprises photoresist, although other photosensitive materials such as polyamide can also be employed.

Figure 2:
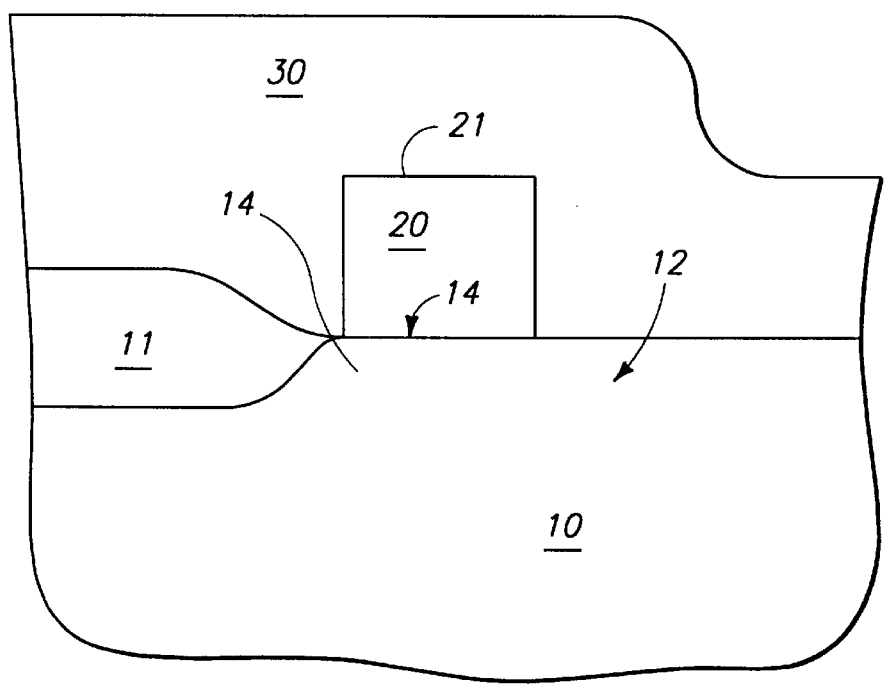
FIG. 2 is a diagrammatic sectional view of the FIG. 1 wafer shown at a processing step subsequent to that shown in FIG. 1.

Referring now to FIG. 2, a first dielectric layer 30 is formed over the first patterned layer of photosensitive material 20. The first dielectric layer is formed at a temperature of less than about 400 degrees C., or at a temperature which does not substantially degrade the first layer of patterned photosensitive material.

Figure 3:
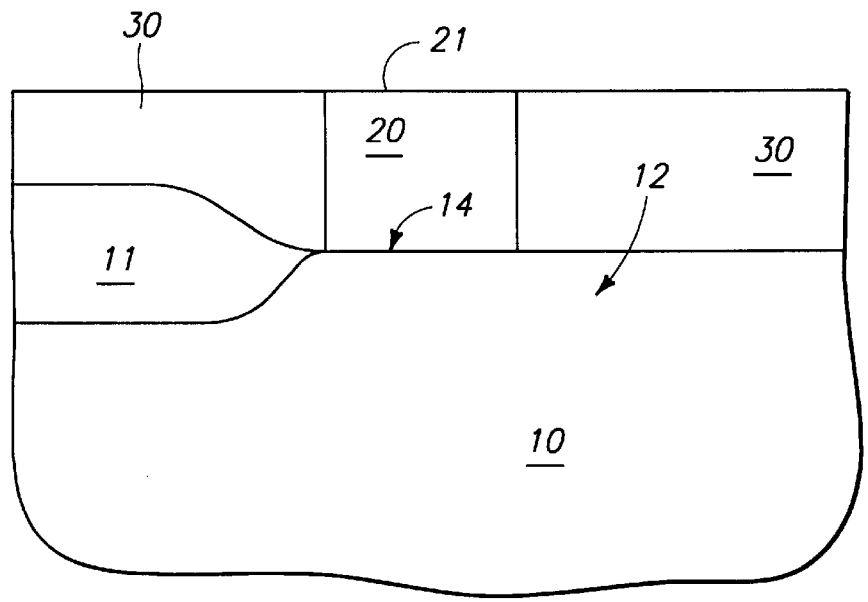
FIG. 3 is a view of FIG. 1 wafer shown at a processing step subsequent to that shown in FIG. 2.

Referring now to FIG. 3, the first dielectric layer 30 is planarized by means of chemical mechanical polishing (CMP); mechanical contact; or other non-slurry based planarization techniques to expose at least a portion of the first patterned layer of photosensitive material 20. As illustrated, the top surface 21 is exposed.

Figure 4:
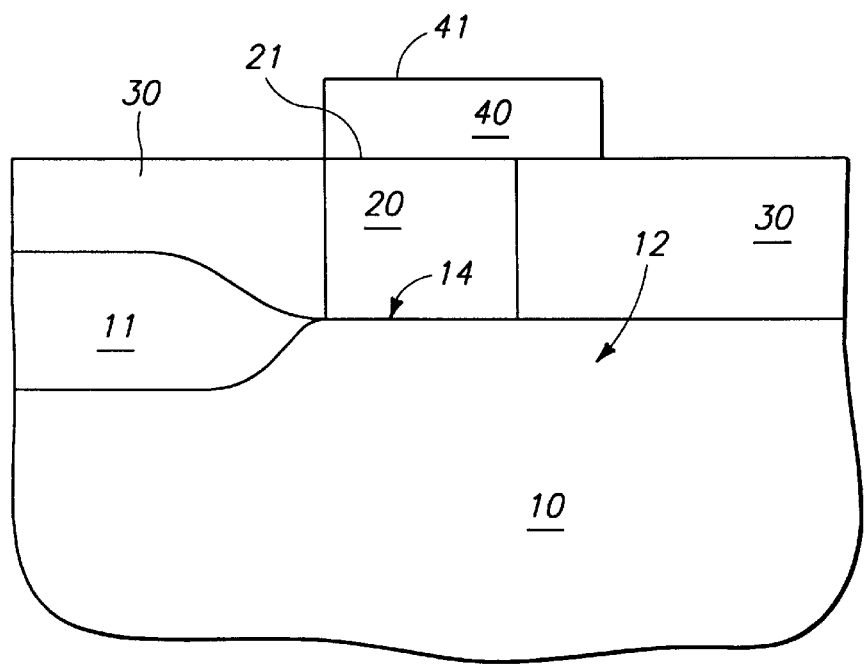
FIG. 4 is a view of the FIG. 1 wafer shown at a processing step subsequent to that shown in FIG. 3.

Referring now to FIG. 4, a second patterned layer of photosensitive material, or upper photosensitive material masking block, 40 is formed over the exposed first patterned layer of photosensitive material 20, and the first dielectric layer 30. The second pattern layer of photosensitive material 40 has a top surface 41. Preferably, the lower photosensitive masking block 20 comprises a positive image of a contact opening to the node location 14, and the upper photosensitive masking block 40 comprises a positive image of a circuit component such as a conductive line running into and out of the plane of the page upon which FIG. 4 lies. The first and second patterned layers of photosensitive material may comprise the same, or different substances.

Figure 5:
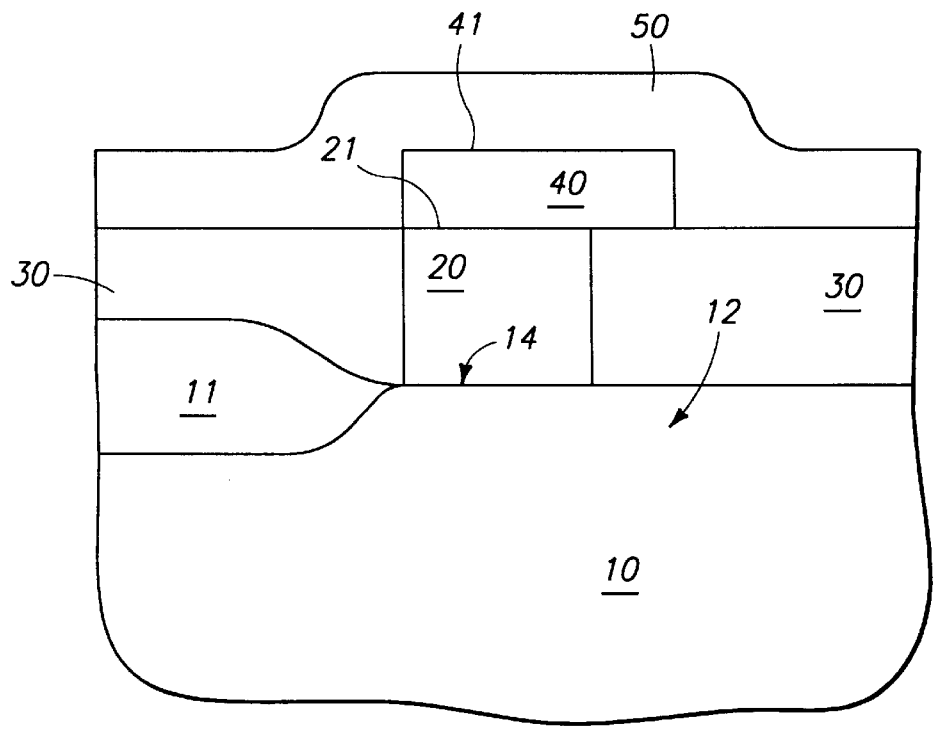
FIG. 5 is a view of the FIG. 4 wafer shown at a processing step subsequent to that shown in FIG. 4.

Referring now to FIG. 5, a second dielectric layer 50 is formed over the second patterned layer of photosensitive material 40. The second dielectric layer 50 may constitute the same or different materials from that provided in the first dielectric layer 30. Examples of preferred dielectric materials for layers 30 and 50, comprise for example, boron and/or phosphorus doped silicate glass, although other materials may be used with equal success.

Figure 6:
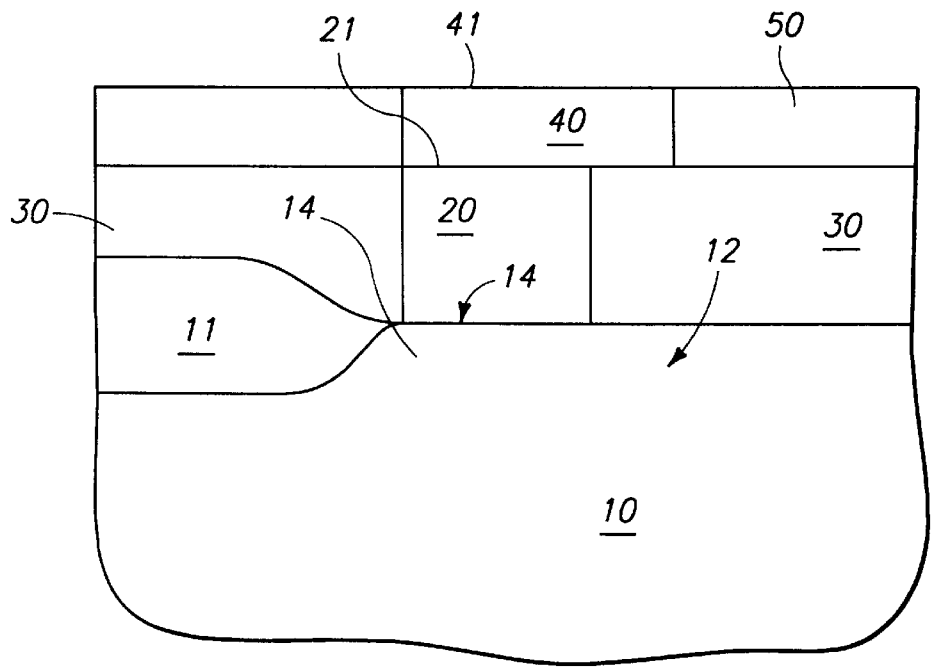
FIG. 6 is a view of the FIG. 1 wafer shown at a processing step subsequent to that shown in FIG. 5.

Referring now to FIG. 6, after forming the second dielectric layer 50 over the second patterned layer of photosensitive material 40, the method further comprises planarizing the second dielectric layer 50, preferably by means of chemical mechanical polishing, or other planarization techniques, as discussed earlier, to expose at least a portion of the second patterned layer of photosensitive material 40. As shown in FIG. 6, the top surface 41 is exposed.

Figure 7:
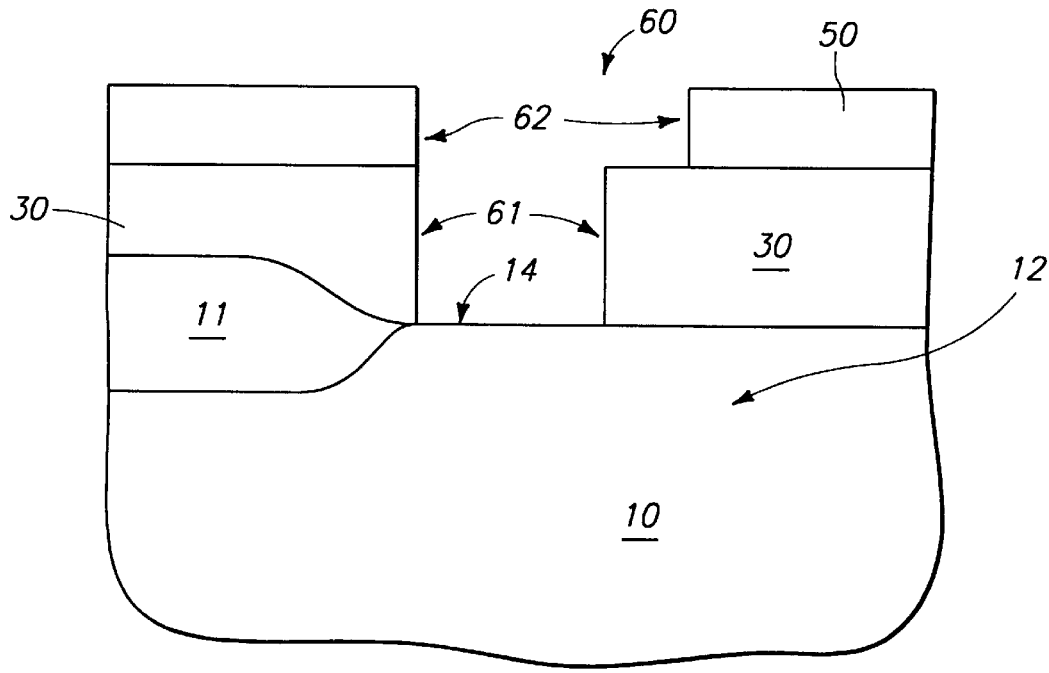
FIG. 7 is a view of the FIG. 1 wafer shown a processing step subsequent to that shown in FIG. 6.

Referring now to FIG. 7, after planarization of the second dielectric layer 50, the method further comprises removing the first and second patterned layers of photosensitive material 20 and 40. The removal of the first and second patterned layers of photosensitive material 20 and 40 forms a void 60 to the underlying node location 14. In particular, removing the upper and lower photosensitive masking blocks 20 and 40 results in a contact opening void 61, and an overlying circuit component void 62 in the form of a conductive line, being defined.

Figure 8:
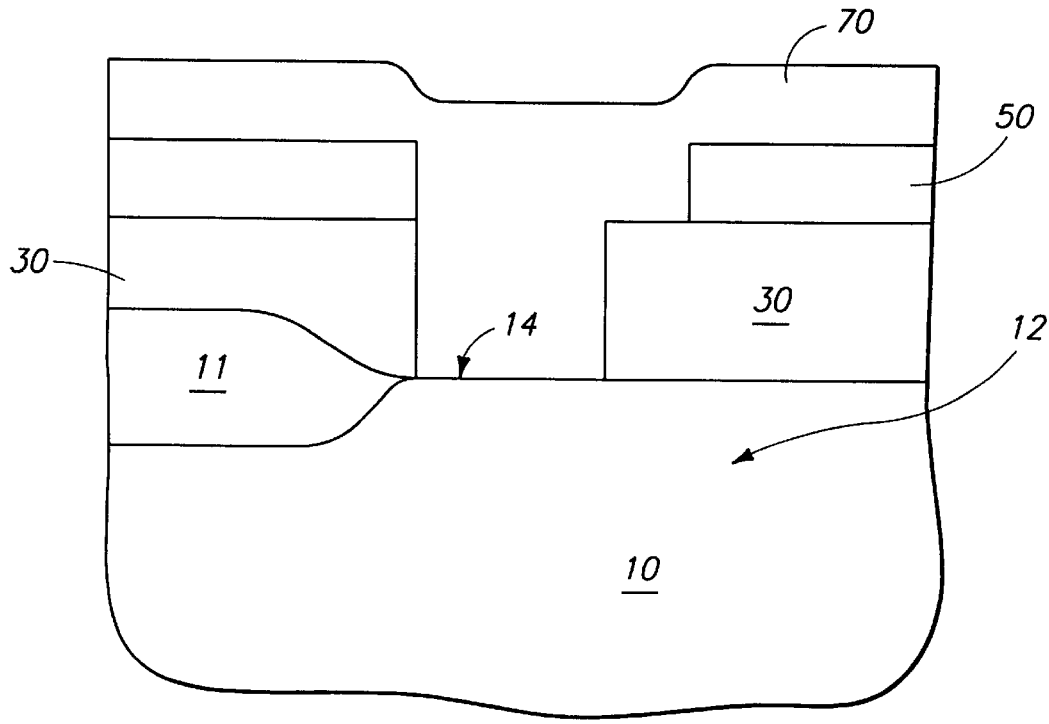
FIG. 8 is a view of the FIG. 1 wafer shown at a processing step subsequent to that shown in FIG. 7.

Referring now to FIG. 8, the method further comprises overfilling the contact opening void 61 and overlying circuit component void 62 with conductive material 70 to make electrical contact to the node location 14.

Figure 9:
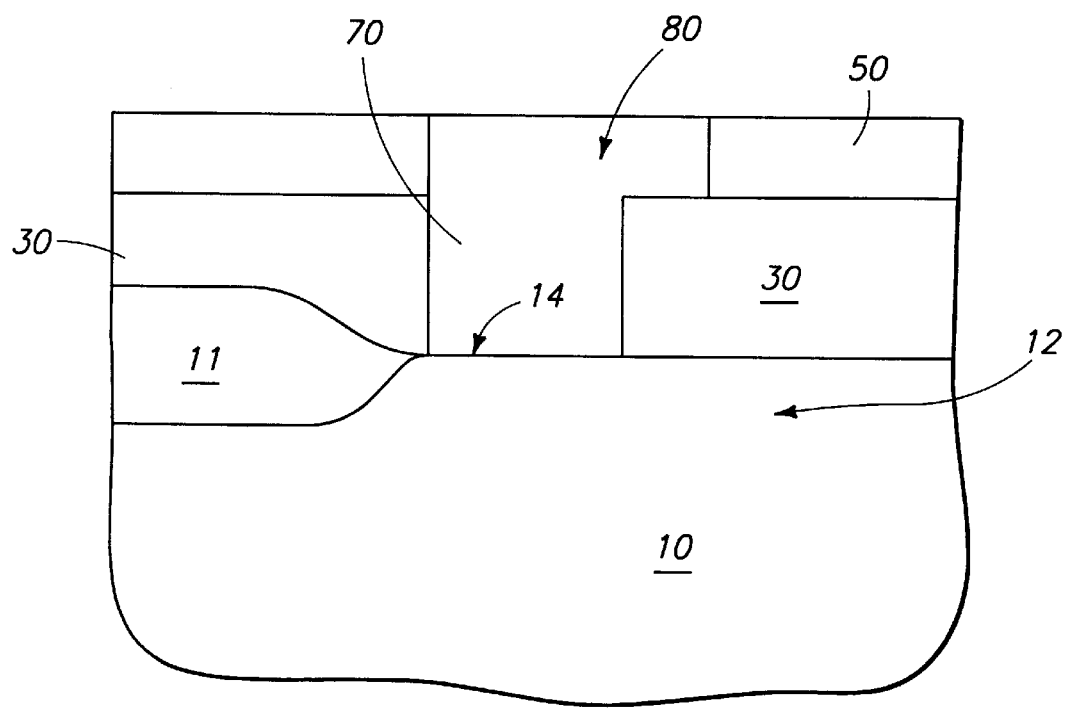
FIG. 9 is a view of the FIG. 1 wafer shown a processing step subsequent to that shown in FIG. 8.

Referring now to FIG. 9, the method further comprises subsequently planarizing the electrically conductive material 70, as by means of CMP or other planarization techniques, such as non-slurry based means, to form a desired circuit component shape 80.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method for forming a circuit component in electrical connection with a lower node location, comprising:

forming upper and lower photosensitive material masking blocks over the node location, and wherein the step of forming the upper and lower photosensitive masking blocks comprises separately providing and patterning first and second layers of photosensitive material, and wherein, the lower photosensitive masking block comprises a positive image of a contact opening to the node location, and the upper photosensitive masking block comprising a positive image of a circuit component;

forming dielectric material around the upper and lower photosensitive masking blocks, and wherein the step of forming the dielectric material comprises separately providing first and second layers of dielectric material, and wherein the lower masking block remains in covering relation over the node location after providing the first and second dielectric layers;

removing the upper and lower photosensitive masking blocks in a single operation from the dielectric material to leave a contact opening void and an overlying circuit component void; and filling the contact opening void and overlying circuit component void with electrically conductive material to form a circuit component in electrical connection with the node location.

2. A method for forming a circuit component as claimed in claim 1, wherein filling the void with electrically conductive material comprises overfilling the void with electrically conductive material; and subsequently planarizing the electrically conductive material to form a desired circuit component shape.

3. A method for forming a circuit component as claimed in claim 2, wherein forming the upper and lower photosensitive material masking blocks comprises separately providing and patterning first and second layers of photosensitive material.

4. A method for forming a circuit component as claimed in claim 1, wherein planarizing the electrically conductive material is achieved by means of chemical mechanical polishing.

5. A method for forming a circuit component as claimed in claim 1, wherein planarizing the electrically conductive material is achieved through the use of mechanical contact.

6. A method for forming a circuit component as claimed in claim 1, wherein planarizing the electrically conductive material is achieved by means of a non-slurry based planarizing operation.

* * * * *

UNITED STATES PATENT AND TRADEMARK OFFICE
CERTIFICATE OF CORRECTION

PATENT NO. : 6,114,232
DATED : September 5, 2000
INVENTOR(S) : John H. Givens

It is certified that error appears in the above-identified patent and that said Letters Patent is hereby corrected as shown below:

In Column 2, line 7, delete "shown", and insert the words —shown at—.

In Column 2, line 11, delete "shown", and insert the words —shown at—.

Signed and Sealed this

Fifth Day of June, 2001

*Attest:*

*Nicholas P. Godici*

*Attesting Officer*

NICHOLAS P. GODICI
*Acting Director of the United States Patent and Trademark Office*